US010192486B2

(12) United States Patent
He et al.

(10) Patent No.: US 10,192,486 B2
(45) Date of Patent: Jan. 29, 2019

(54) PIXEL CIRCUIT, A DRIVING METHOD FOR DRIVING THE PIXEL CIRCUIT, AND A DISPLAY DEVICE

(71) Applicants: BOE TECHNOLOGY GROUP CO., LTD., Beijing (CN); CHENGDU BOE OPTOELECTRONICS TECHNOLOGY CO., LTD., Chengdu, Sichuan (CN)

(72) Inventors: Xiaoxiang He, Beijing (CN); Xiaojing Qi, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan (CN)

( * ) Notice: Subject to any disclaimer, the term of this patent is extended or adjusted under 35 U.S.C. 154(b) by 0 days.

(21) Appl. No.: 15/519,673

(22) PCT Filed: Jul. 28, 2016

(86) PCT No.: PCT/CN2016/092087
§ 371 (c)(1),
(2) Date: Apr. 17, 2017

(87) PCT Pub. No.: WO2017/117985
PCT Pub. Date: Jul. 13, 2017

(65) Prior Publication Data

US 2018/0096653 A1 Apr. 5, 2018

(30) Foreign Application Priority Data

Jan. 4, 2016 (CN) .......................... 2016 1 0004113

(51) Int. Cl.
*G09G 3/32* (2016.01)
*G09G 3/3258* (2016.01)
(Continued)

(52) U.S. Cl.
CPC ......... *G09G 3/3258* (2013.01); *G09G 3/3208* (2013.01); *G09G 3/3233* (2013.01);
(Continued)

(58) Field of Classification Search
CPC ................ G09G 3/3258; G09G 3/3233; H01L 51/5206; H01L 51/5221
(Continued)

(56) References Cited

U.S. PATENT DOCUMENTS 8,242,981 B2 8/2012 Kim
2011/0164016 A1* 7/2011 Kang .................. G09G 3/3233 345/211
(Continued)

FOREIGN PATENT DOCUMENTS

CN 103413520 A 11/2013
CN 103514833 A 1/2014
(Continued)

OTHER PUBLICATIONS

International Search Report and Written Opinion dated Oct. 28, 2016; PCT/CN2016/092087.
(Continued)

*Primary Examiner* — Jonathan Blancha
(74) *Attorney, Agent, or Firm* — Ladas & Parry LLP

(57) ABSTRACT

A pixel circuit, a driving method and a display device are provided. The pixel circuit includes a threshold compensation unit, configured to pull voltage of first node and voltage of first level terminal uniform, pull voltage of third node and voltage of second node uniform, and make the voltage of the first node and the voltage of the third node have an equipotential change; a driving unit, configured to output driving current; a data writing unit, configured to pull the voltage of the third node and the voltage of a data signal terminal uniform; a resetting unit, configured to pull a voltage of
(Continued)

fourth node and a voltage of a third level terminal uniform; an EL light-emitting unit, configured to display gray scales through driving current; and a feedback unit, configured to make the voltage of the third node and the voltage of the fourth node have an equipotential change.

15 Claims, 5 Drawing Sheets

(51) Int. Cl.
*G09G 3/3208* (2016.01)
*G09G 3/3233* (2016.01)
*H01L 51/52* (2006.01)

(52) U.S. Cl.
CPC ...... *H01L 51/5206* (2013.01); *H01L 51/5221* (2013.01); *G09G 2310/0264* (2013.01)

(58) Field of Classification Search
USPC ........................................................... 345/83
See application file for complete search history.

(56) References Cited

U.S. PATENT DOCUMENTS

2012/0026146 A1* 2/2012 Kim .................... G09G 3/3233 345/211
2013/0335391 A1 12/2013 Kim
2015/0109278 A1* 4/2015 Kim .................... G09G 3/3233 345/211
2015/0154906 A1 6/2015 Chung
2015/0302798 A1 10/2015 Tan
2016/0372030 A1* 12/2016 Nagayama ............... G09G 3/32

FOREIGN PATENT DOCUMENTS

CN 103778689 A 5/2014
CN 104821150 A 8/2015
CN 105489163 A 4/2016
CN 205282056 U 6/2016

OTHER PUBLICATIONS

The First Chinese Office Action dated Aug. 3, 2017; Appln. No, 201610004113.8.
The Third Chinese Office Action dated Jul. 17, 2016; Appln. No. 201610004113.8.

* cited by examiner

PIXEL CIRCUIT, A DRIVING METHOD FOR DRIVING THE PIXEL CIRCUIT, AND A DISPLAY DEVICE

TECHNICAL FIELD

The present disclosure relates to a pixel circuit, a driving method thereof and a display device.

BACKGROUND

An organic light-emitting diode (OLED) display is one of the hot topics nowadays in the panel display research field. Compared with a conventional liquid crystal display (LCD), the OLED display has advantages of low power consumption, low manufacturing cost, self-luminance, broad angle of view and fast response speed and so on. At present, in a field of displays such as a mobile phone, a personal digital assistant (PDA), a digital camera or the like, the OLED display has started to take place of the conventional liquid crystal display.

Design of a pixel driving circuit is core technical content of the OLED display, and has important research significance. Being different from a thin film transistor (TFT) LCD which controls brightness by utilizing a stable voltage, the OLED display is driven by utilizing current, and thus requires stable current to control light emitting. However, because of influence of TFT manufacturing process, the stability of a threshold voltage of a driving transistor is very poor. Different driving transistors have different threshold voltages while being input a same voltage, such that driving current flowing through different organic light-emitting diodes are different, which further causes the stability of driving current of the OLED display very poor. In the meantime, with the increasing of operating time of the driving transistors, drift would occur to the threshold voltage of driven transistors, thereby further influencing the stability of the driving current. The stability of the driving current would influence the stability of display brightness of the OLED display. Therefore, how to raise the stability of the driving current and then improve uniformity of display brightness of a display device is a problem to be solved urgently by those skilled in the art.

SUMMARY

There are provided in embodiments of the present disclosure a pixel circuit, a driving method thereof and a display device, which are used to raise the stability of driving current and then improve uniformity of display brightness of the display device.

According to one aspect, there is provided in the present disclosure a pixel circuit, comprising: a threshold compensation unit, a driving unit, a data writing unit, a resetting unit, an EL light-emitting unit and a feedback unit.

The threshold compensation unit is connected to a first level terminal, a first scanning signal terminal, a first node, a second node and a third node, and is configured to pull a voltage of the first node and a voltage of the first level terminal to be uniform under control of a voltage of the first scanning signal terminal and pull a voltage of the third node and a voltage of the second node to be uniform under control of the voltage of the first scanning signal terminal. The threshold compensation unit is further configured to make the voltage of the first node and the voltage of the third node have an equipotential change and store the voltage of the first node and the voltage of the third node.

The driving unit is connected to the first node, the second node, a second level terminal, a fourth node and a third scanning signal terminal, and is configured to output a driving current through the fourth node under control of the voltage of the first node and a voltage of the third scanning signal terminal, or adjust the voltage of the second node into a voltage difference between the voltage of the first node and a threshold voltage of the driving unit under control of the voltage of the first node.

The data writing unit is connected to a data signal terminal, a second scanning signal terminal and the third node, and is configured to pull the voltage of the third node and the voltage of the data signal terminal to be uniform under control of a voltage of a second scanning signal terminal.

The resetting unit is connected to the second scanning signal terminal, a third level terminal and the fourth node, and is configured to pull a voltage of the fourth node and a voltage of a third level terminal to be uniform under control of the voltage of the second scanning signal terminal.

The EL light-emitting unit is connected to the fourth node and a fourth level terminal, and is configured to display gray scales through a driving current input by the fourth node.

The feedback unit is connected to the third node and the fourth node, and is configured to store the voltage of the third node and the voltage of the fourth node and make the voltage of the third node and the voltage of the fourth node have an equipotential change.

Optionally, the threshold compensation unit comprises a first transistor, a second transistor and a first capacitor.

A first terminal of the first transistor is connected to the first level terminal, a second terminal thereof is connected to the first node, and a gate thereof is connected to the first scanning signal terminal. A first terminal of the second transistor is connected to the second node, a second terminal thereof is connected to the third node, and a gate thereof is connected to the first scanning signal terminal. A first electrode of the first capacitor is connected to the first node, and a second electrode thereof is connected to the third node.

Optionally, the driving unit comprises a driving transistor and a third transistor. A source of the driving transistor is connected to the second level terminal, a drain thereof is connected to the second node, and a gate thereof is connected to the first node. A first terminal of the third transistor is connected to the second node, a second terminal thereof is connected to the fourth node, and a gate thereof is connected to the third scanning signal terminal.

Optionally, the data writing unit comprises a fourth transistor. A first terminal of the fourth transistor is connected to the data signal terminal, a second terminal thereof is connected to the third node, and a gate thereof is connected to the second scanning signal terminal.

Optionally, the resetting unit comprises a fifth transistor. A first terminal of the fifth transistor is connected to the third level terminal, a second terminal thereof is connected to the fourth node, and a gate thereof is connected to the second scanning signal terminal.

Optionally, the EL light-emitting unit comprises a light-emitting diode. An anode of the light-emitting diode is connected to the fourth node, and a cathode thereof is connected to the fourth level terminal.

Optionally, the feedback unit comprises a second capacitor. A first electrode of the second capacitor is connected to the third node, and a second electrode thereof is connected to the fourth node.

According to a second aspect, there is provided in the present disclosure a driving method for driving the pixel circuit according to the first aspect of the present disclosure, comprising:

in a first phase, pulling a voltage of a first node and a voltage of a first level terminal to be uniform and pulling a voltage of a third node and a voltage of a second node to be uniform by the threshold compensation unit under control of a voltage of a first scanning signal terminal, adjusting the voltage of the second node into a voltage difference between the voltage of the first node and a threshold voltage of the driving unit by the driving unit under control of the voltage of the first node, and storing the voltage of the first node and the voltage of the third node by the threshold compensation unit.

in a second phase, pulling the voltage of the third node and a voltage of a data signal terminal to be uniform by the data writing unit under control of a voltage of a second scanning signal terminal, making the voltage of the first node and the voltage of the third node have an equipotential change by the threshold compensation unit, pulling a voltage of a fourth node and a voltage of a third level terminal to be uniform by the resetting unit under control of the voltage of the first scanning signal terminal, and making the voltage of the third node and the voltage of the fourth node have an equipotential change by the feedback unit; and in a third phase, outputting a driving current through a fourth node by the driving unit under control of the voltage of the first node and a voltage of a third scanning signal terminal, making the voltage of the third node and the voltage of the fourth node have an equipotential change by the feedback unit, making the voltage of the first node and the voltage of the third node have an equipotential change by the threshold compensation unit, and displaying gray scales through a driving current input by the fourth node by the EL light-emitting unit.

According to a third aspect, there is provided in the present disclosure a display device, comprising the pixel circuit according to the first aspect of the present disclosure.

The pixel circuit provided in the embodiments of the present disclosure comprises the threshold compensation unit, the driving unit, the data writing unit, the resetting unit, the EL light-emitting unit and the feedback unit. The threshold compensation unit can pull the voltage of the first node and the voltage of the first level terminal uniform. The voltage of the first node can control the driving unit to adjust the voltage of the second node into the voltage difference between the voltage of the first node and the threshold voltage of the driving unit. The threshold compensation unit can further pull the voltage of the third node and the voltage of the second node uniform, and store the voltage of the first node and the voltage of the third node. The data writing unit can pull the voltage of the third node and the voltage of the data signal terminal uniform. The resetting unit can pull the voltage of the fourth node and the voltage of the third level terminal uniform. The threshold compensation unit can further make the voltage of the first node and the voltage of the third node have an equipotential change. The resetting unit can pull the voltage of the fourth node and the voltage of the third level terminal uniform. The feedback unit can make the voltage of the third node and the voltage of the fourth node make an equipotential change. Thus, the voltage of the first node can be changed into a voltage sum obtained by adding the threshold voltage of the driving unit with a voltage difference obtained by subtracting the voltage of the third level terminal from the voltage of the data signal terminal, such that a magnitude of a driving current output by the driving unit is unrelated with the driving unit thereby eliminating the influence of the threshold voltage of the driving unit on the driving current. Thus, the stability of the driving current can be raised, and then the uniformity of display brightness of the display device can be improved.

DETAILED DESCRIPTION

Technical solutions in embodiments of the present disclosure will be described below clearly and completely by combining with figures. Obviously, the embodiments described below are just a part of embodiments of the present disclosure, but not all the embodiments.

Transistors adopted in all embodiments of the present disclosure can be thin film transistors or field effect transistors, or use other devices having same characteristics. According to different functions in the circuit, transistors adopted in the embodiments of the present disclosure can comprise switch transistors and driving transistors.

Sources and drains of transistors adopted herein are symmetrical, so that their sources and drains can be exchanged with each other. In the embodiments of the present disclosure, in order to distinguish two electrodes of a transistor other than a gate thereof, one electrode thereof is called as a first terminal, and another electrode thereof is called as a second terminal. For example, an intermediate terminal of the transistor is a gate, a signal input terminal thereof is a source, and a signal output terminal is a drain.

Additionally, in the embodiments of the present disclosure, switch transistors can comprise P type switch transistors and N type switch transistors, wherein the P type switch transistors are turned on when their gates are at low level and turned off when their gates are at high level, while the N type switch transistors are turned on when their gates are at high level and turned off when their gates are at low level. Driving transistors can comprise P type driving transistors and N type driving transistors, wherein the P type driving transistors are in an amplified state or in a saturated state when a voltage of a gate is at low level (the voltage of the gate is smaller than a gate of a source) and an absolute value of a voltage difference between the gate and the source is greater than a threshold voltage, while the N type driving transistors are in an amplified state or in a saturated state when a voltage of a gate is at high level (the voltage of the gate is smaller than a gate of a source) and an absolute value of a voltage difference between the gate and the source is greater than a threshold voltage.

Figure 1:
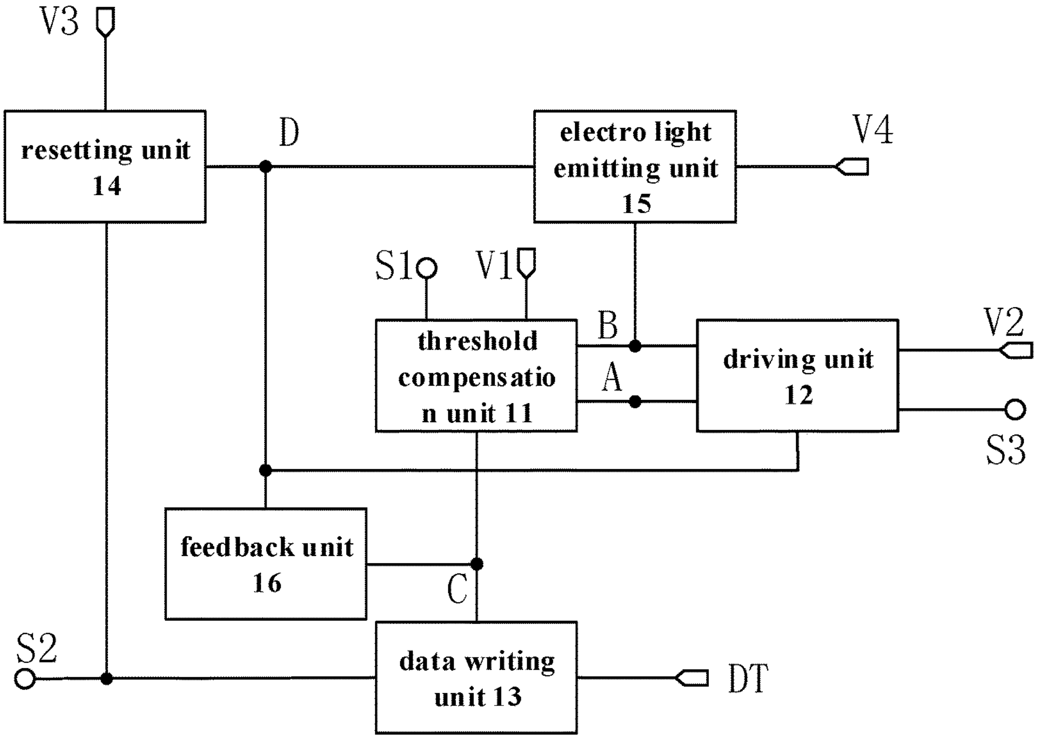
FIG. 1 is a schematic diagram of structure of a pixel circuit provided in an embodiment of the present disclosure.

As shown in FIG. 1, a pixel circuit provided in an embodiment of the present disclosure comprises a threshold compensation unit 11, a driving unit 12, a data writing unit 13, a resetting unit 14, an EL light-emitting unit 15 and a feedback unit 16.

The threshold compensation unit 11 is connected to a first level terminal V1, a first scanning signal terminal S1, a first node A, a second node B and a third node C, and is configured to pull a voltage of the first node A and a voltage of the first level terminal V1 to be uniform and pull a voltage of the third node C and a voltage of the second node B to be uniform under the control of a voltage of the first scanning signal terminal S1. The threshold compensation unit 11 is further configured to make the voltage of the first node A and the voltage of the third node V have an equipotential change and store the voltage of the first node A and the voltage of the third node C.

The driving unit 12 is connected to the first node A, the second node B, a second level terminal V2, a fourth node D and a third scanning signal terminal S3, and is configured to output a driving current through the fourth node D under the control of the voltage of the first node A and a voltage of the third scanning signal terminal S3, or adjust the voltage of the second node B into a voltage difference between the voltage of the first node A and a threshold voltage of the driving unit 12 under the control of the voltage of the first node A.

The data writing unit 13 is connected to a data signal terminal DT, a second scanning signal terminal S2 and a third node C, and is configured to pull the voltage of the third node C and a voltage of the data signal terminal DT to be uniform under the control of a voltage of the second scanning signal terminal S2.

The resetting unit 14 is connected to the second scanning signal terminal S2, a third level terminal V3 and the fourth node D, and is configured to pull a voltage of the fourth voltage D and a voltage of the third level terminal V3 to be uniform under the control the voltage of the second scanning signal terminal S2.

The EL light-emitting unit 15 is connected to the fourth node D) and a fourth level terminal V4, and is configured to display gray scales through a driving current input by the fourth node D.

The feedback unit 26 is connected to the third node C and the fourth node 1), and is configured to store the voltage of the third node C and the voltage of the fourth node D and make the voltage of the third node C and the voltage of the fourth node D have an equipotential change.

The pixel circuit provided in the embodiments of the present disclosure comprises the threshold compensation unit, the driving unit, the data writing unit, the resetting unit, the EL light-emitting unit and the feedback unit. The threshold compensation unit can pull the voltage of the first node and the voltage of the first level terminal uniform. The voltage of the first node can control the driving unit to adjust the voltage of the second node into the voltage difference between the voltage of the first node and the threshold voltage of the driving unit. The threshold compensation unit can further pull the voltage of the third node and the voltage of the second node uniform, and store the voltage of the first node and the voltage of the third node. The data writing unit can pull the voltage of the third node and the voltage of the data signal terminal uniform. The resetting unit can pull the voltage of the fourth node and the voltage of the third level terminal uniform. The threshold compensation unit can further make the voltage of the first node and the voltage of the third node have an equipotential change. The resetting unit can pull the voltage of the fourth node and the voltage of the third level terminal uniform. The feedback unit can make the voltage of the third node and the voltage of the fourth node make an equipotential change. Thus, the voltage of the first node can be changed into a voltage sum obtained by adding the threshold voltage of the driving unit with a voltage difference obtained by subtracting the voltage of the third level terminal from the voltage of the data signal terminal, such that a magnitude of a driving current output by the driving unit is unrelated with the driving unit, so as to eliminate influence of the threshold voltage of the driving unit on the driving current. Thus, the stability of the driving current can be raised, and then uniformity of display brightness of the display device can be improved.

Figure 2:
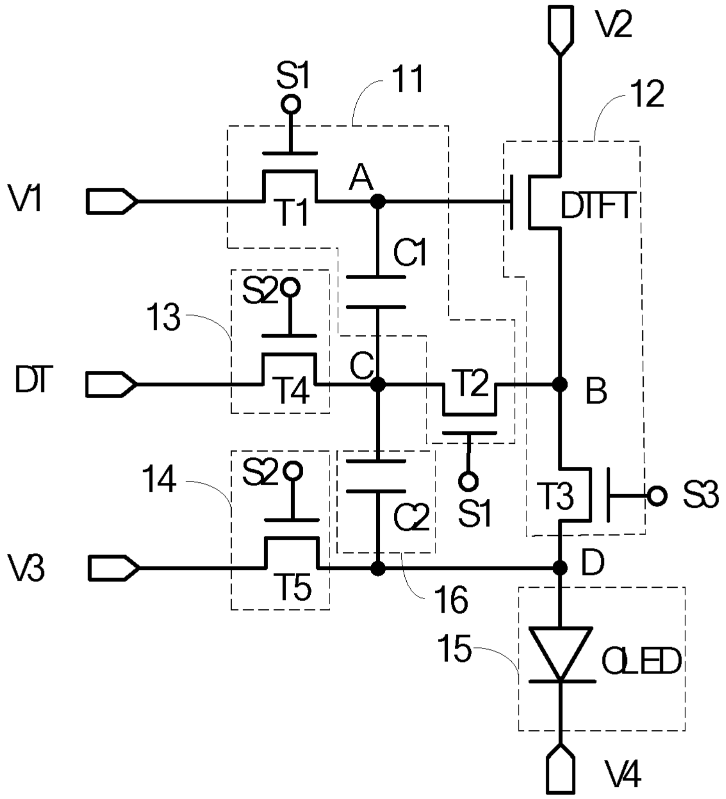
FIG. 2 is a circuit diagram of a pixel circuit provided in an embodiment of the present disclosure.

Optionally, as shown in FIG. 2, the threshold compensation unit 11 can comprise a first transistor T1, a second transistor T2, and a first capacitor C1. A first terminal of the first transistor T1 is connected to the first level terminal V1, a second terminal thereof is connected to the first node A, and a gate thereof is connected to the first scanning signal terminal S1. A first terminal of the second transistor 12 is connected to the second node B, a second terminal thereof is connected to the third node C, and a gate thereof is connected to the first scanning signal terminal S1. A first electrode of the first capacitor C1 is connected to the first node A, and a second electrode thereof is connected to the third node C.

Optionally, as shown in FIG. 2, the driving unit 12 can comprise a driving transistor DTFT and a third transistor T3. A source of the driving transistor DTFT is connected to the second level terminal V2, a drain thereof is connected to the second node B, and a gate thereof is connected to the first node A. A first terminal of the third transistor T3 is connected to the second node B, a second terminal thereof is connected to the fourth node D, and a gate thereof is connected to the third scanning signal terminal S3.

Optionally, as shown in FIG. 2, the data writing unit 13 can comprise a fourth transistor T4. A first terminal of the fourth transistor T4 is connected to the data signal terminal DT, a second terminal thereof is connected to the third node C, and a gate thereof is connected to the second scanning signal terminal S2.

Optionally, as shown in FIG. 2, the resetting unit 14 can comprise a fifth transistor 1T5. A first terminal of the fifth transistor T5 is connected to the third level terminal V3, a second terminal thereof is connected to the fourth node D, and a gate thereof is connected to the second scanning signal terminal S2.

Optionally, as shown in FIG. 2, the EL light-emitting unit 15 can comprise a light-emitting diode OLED. An anode of the light-emitting diode OLED is connected to the fourth node D, and a cathode thereof is connected to the fourth level terminal V4.

Optionally, as shown in FIG. 2, the feedback unit 16 can comprise a second capacitor C2. A first electrode of the second capacitor C2 is connected to the third node C, and a second electrode thereof is connected to the fourth node D.

Figure 3:
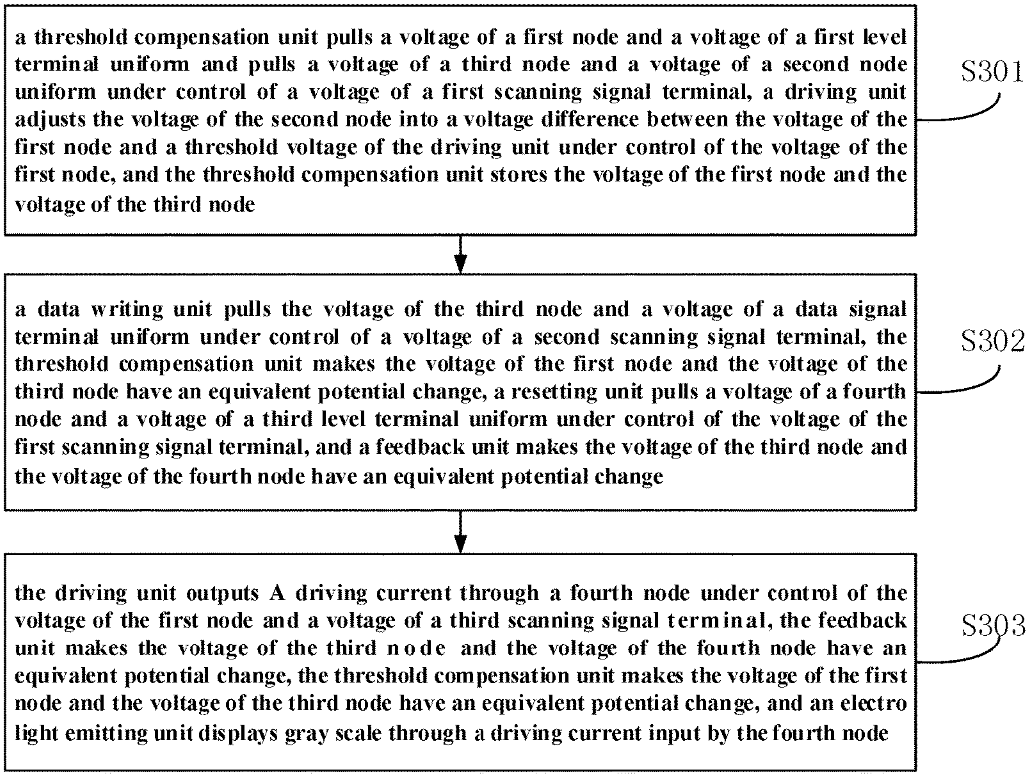
FIG. 3 is a flow diagram of steps of a driving method of a pixel circuit provided in an embodiment of the present disclosure.

FIG. 3 is a flow diagram of steps of a driving method of a pixel circuit provided in an embodiment of the present disclosure.

As shown in FIG. 3, in a first phase S301, the threshold compensation unit pulls the voltage of the first node and the voltage of the first level terminal to be uniform and pulls the voltage of the third node and the voltage of the second node to be uniform under control of the voltage of the first scanning signal terminal, the driving unit adjusts the voltage of the second node into a voltage difference between the voltage of the first node and the threshold voltage of the driving unit under control of the voltage of the first node, and the threshold compensation unit stores the voltage of the first node and the voltage of the third node.

In a second phase S302, the data writing unit pulls the voltage of the third node and the voltage of the data signal terminal to uniform under control of the voltage of the second scanning signal terminal, the threshold compensation unit makes the voltage of the first node and the voltage of the third node have an equipotential change, the resetting unit pulls the voltage of the fourth node and the voltage of the third level terminal to be uniform under control of the voltage of the first scanning signal terminal, and a feedback unit makes the voltage of the third node and the voltage of the fourth node have an equipotential change;

In a third phase S303, the driving unit outputs a driving current through the fourth node under control of the voltage of the first node and the voltage of a third scanning signal terminal, the feedback unit makes the voltage of the third node and the voltage of the fourth node have an equipotential change, the threshold compensation unit makes the voltage of the first node and the voltage of the third node have an equipotential change, and an EL light-emitting unit displays gray scales through the driving current input by the fourth node.

Through the driving method of the pixel circuit provided in the embodiment of the present disclosure, during the first phase, the voltage of first node and the voltage of the first level terminal are pulled uniform, the second voltage of the second node is adjusted into the voltage difference between the voltage of the first node and the threshold voltage of the driving unit, the voltage of the third node and the voltage of the second node are pulled uniform, and the voltage of the first node and the voltage of the third node are stored. During the second phase, the voltage of the third node and the voltage of the data signal terminal are pulled uniform, the voltage of the fourth node and the voltage of the third level terminal are pulled uniform, and then the voltage of the third node and the voltage of the fourth node are made to have an equipotential change, and the voltage of the first node and the voltage of the third node are made to have an equipotential change. During the third phase, under control of the voltage of the first node, the driving current is output through the fourth node, and the gray scale is displayed through the EL light-emitting unit. During the third phase, the voltage of the first node would be changed into a voltage sum obtained by adding the threshold voltage of the driving unit with a voltage difference obtained by subtracting the voltage of the third level terminal from the voltage of the data signal terminal, such that a magnitude of a driving current output by the driving unit is not influenced by the threshold unit of the driving unit. The driving method of the pixel circuit provided in the embodiment of the present disclosure can raise stability of the driving current, and then improve uniformity of display brightness of the display device.

Returning to FIG. 2, in an embodiment, all transistors in the pixel circuit can be N type transistors, and the first level terminal V1 and the third level terminal V3 provide a reference voltage (their voltage values can be set according to specific usage scenarios of the pixel circuit, to which the present disclosure does not limit), the second level terminal V2 provides a high level, and the fourth level terminal V4 provides a low level (for example, the fourth level terminal V4 can be a ground terminal). In this circumstance, timing states of the first scanning signal terminal S1, the second scanning signal terminal S2, the third scanning signal terminal S3 and the data signal terminal DT in this pixel circuit are as shown in FIG. 4.

Figure 4:
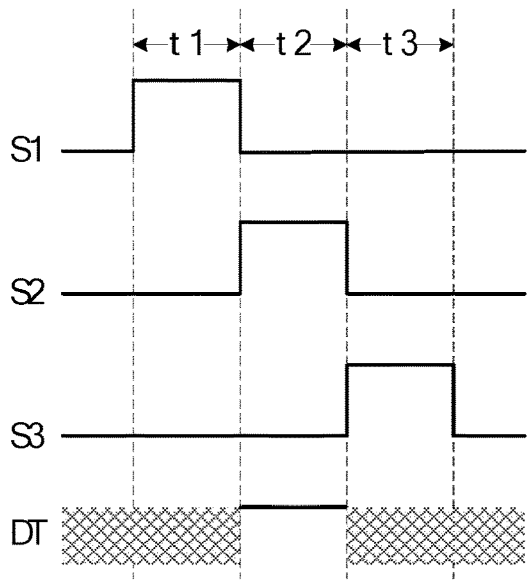
FIG. 4 is a timing diagram of timing signals in a pixel circuit provided in an embodiment of the present disclosure.
Figure 5:
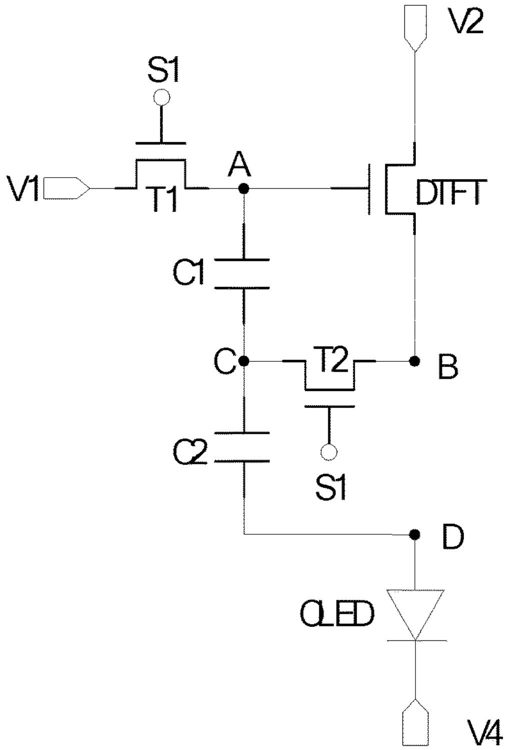
FIG. 5 is an equivalent circuit diagram of a pixel circuit in a first phase provided in an embodiment of the present disclosure.

As shown in FIG. 4, during a first phase t1, S1 is a high level, and S2 and S3 are low levels. Therefore, T1 and T2 are turned on, and remaining switch transistors are turned off. An equivalent circuit diagram at this time is as shown in FIG. 5.

In this phase, the voltage of the first node A is $V_A=V_1$, and due to the control of the voltage of the first node A, the voltage of the second node B and the third node C is $V_B=V_C=V_1-V_{th}$, where $V_1$ is the voltage of the first level terminal, $V_{th}$ is the threshold voltage of the driving transistor DTFT, and the first capacitor C1 stores voltages of the first node A and the third node C.

Figure 6:
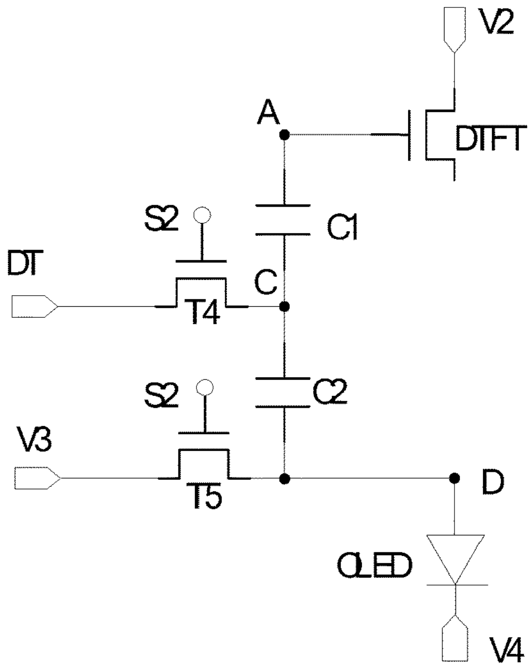
FIG. 6 is an equivalent circuit diagram of a pixel circuit in a second phase provided in an embodiment of the present disclosure.

During a second phase t2, S1 and S3 are low levels, S2 is a high level, and the data signal terminal DT is input a data signal. Therefore, T4 and T5 are turned on, and remaining switch transistors are turned off. An equivalent circuit diagram at this time is as shown in FIG. 6.

In this phase, the transistor T4 is turned on, the data signal terminal DT inputs the data signal to the node C, and the voltage of the third node C is Vc=Vdt. Since the voltage of the first node A in the phase t1 is $V_A=V_1$ and the voltage of the third node C is $V_c=V_1-V_{th}$, and T1 is turned off and the first node A is floated in this phase t2, the voltage of the node A connected to the first electrode of the first capacitor C1 and the voltage of the node C connected to the second electrode of the first capacitor C1 make an equipotential change. The voltage of the first node A is changed into $V_A=V_{dt}+V_{th}$, where $V_{dt}$ is the voltage of the data signal terminal DT. In addition, since T5 is turned on, the voltage of the light-emitting diode OLED is $V_{oled}$=V3 (where $V_3$ is the voltage of the third level terminal), the light-emitting voltage of OLED in a previous frame is cleared, and the capacitor C1 stores voltages of the first node A and the third node C. Exemplarily, $V_3$ can be a reference voltage, and a voltage value of $V_3$ can be set according to the usage scenario of the pixel circuit. The light-emitting voltage of the OLED in the previous frame is cleared through the voltage value of $V_3$, such that the resetting unit in the embodiment can avoid the light-emitting voltage of OLED in the previous frame from influencing the display brightness of the gray scales of OLED.

Figure 7:
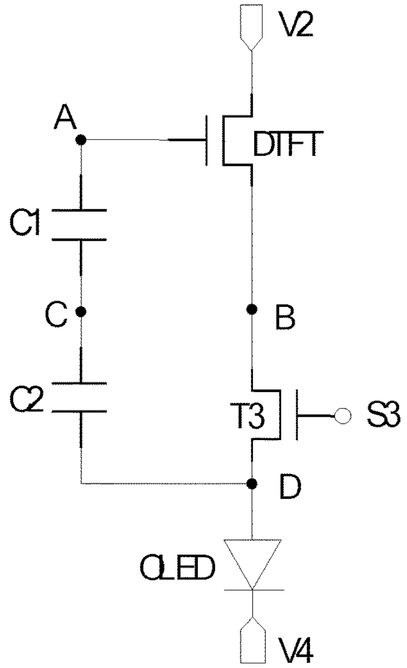
FIG. 7 is an equivalent circuit diagram of a pixel circuit in a third phase provided in an embodiment of the present disclosure.

During a third phase t3, S1 and S2 are low levels, and S3 is a high level. Therefore, T3 is turned on, and remaining switch transistors are turned off. An equivalent circuit diagram at this time is shown in FIG. 7. The driving transistor outputs a driving current, and OLED displays gray scales by the diving current.

Since all the transistors in the embodiment of the present disclosure are N type transistors, a voltage difference between the gate and the source of the driving transistor DTFT is $V_{gs}=V_A-V_{oled}=V_{dt}+V_{th}-V_3$.

According to a saturation current formula, the current flowing through the OLED is:

$$\begin{aligned} Ioled &= K(V_{gs}-V_{th})^2 \\ &= K[V_{dt}+V_{th}-V_3-V_{th}]^2 \\ &= K(V_{dt}-V_3)^2 \end{aligned}$$

where $$K = \mu C_{ox}\frac{W}{L},$$

μ and $C_{ox}$ are process constants, W is a channel width of the driving transistor DTFT, L is a channel length of the driving transistor DTFT, and W and L are optionally-designed constants.

Thus, the driving current $I_{oled}$ is not affected by the threshold voltage $V_{th}$ of the driving transistor DTFT, but is just related with voltages of the data signal terminal DT and the third level terminal V3. Therefore, the pixel driving circuit can output stable driving current without being affected by the threshold voltage $V_{th}$ of the driving transistor DTFT.

Additionally, the first capacitor C1 and the second capacitor in the embodiment are connected in series, and the first electrode of C1 is connected to the gate of the driving transistor DTFT, the second electrode of C2 is connected to the drain of the driving transistor DTFT, and the gate of the driving transistor DTFT is floated. The capacitors C1 and C2 have no charging and discharging paths. Therefore, even if the voltage of the fourth level terminal V4 or the voltage of the light-emitting diode OLED makes a change, the gate of the driving transistor would also make an equipotential change, that is, the voltage difference between the gate and the source of the driving transistor can maintain constant, so that stable driving current can be provided.

It should be noted that the first transistor, the second transistor, the third transistor, the fourth transistor and the fifth transistors in the embodiments can also be P type transistors which are turned on when gates thereof are at low level. If all the transistors are P type transistors, then it only needs to re-adjust timing states of respective input signals. Also, the N type transistors and the P type transistors can be adopted simultaneously. At this time, it needs to ensure that transistors under control of a same timing signal or voltage are transistors of a same type. By taking into account of manufacturing process of transistors, because active layers of different types of transistors are mixed with different materials, adopting the unified type of transistors are more advantageous for the manufacturing process of the pixel circuit.

There is further provided in an embodiment of the present disclosure a display device, comprising the pixel circuit provided in the embodiment of the present disclosure. For example, the display device can be any product or elements having a function of displaying such as an electrode paper, a mobile phone, a panel computer, a television set, a display, a notebook computer, a digital photo frame, and a navigator or the like.

The pixel circuit provided in the embodiments of the present disclosure comprises the threshold compensation unit, the driving unit, the data writing unit, the resetting unit, the EL light-emitting unit and the feedback unit. The threshold compensation unit can pull the voltage of the first node and the voltage of the first level terminal uniform. The voltage of the first node can control the driving unit to adjust the voltage of the second node into the voltage difference between the voltage of the first node and the threshold voltage of the driving unit. The threshold compensation unit can further pull the voltage of the third node and the voltage of the second node uniform, and store the voltage of the first node and the voltage of the third node. The data writing unit can pull the voltage of the third node and the voltage of the data signal terminal uniform. The resetting unit can pull the voltage of the fourth node and the voltage of the third level terminal uniform. The threshold compensation unit can further make the voltage of the first node and the voltage of the third node have an equipotential change. The resetting unit can pull the voltage of the fourth node and the voltage of the third level terminal uniform. The feedback unit can make the voltage of the third node and the voltage of the fourth node make an equipotential change. Thus, the voltage of the first node can be changed into a voltage sum obtained by adding the threshold voltage of the driving unit with a voltage difference obtained by subtracting the voltage of the third level terminal from the voltage of the data signal terminal, such that a magnitude of a driving current output by the driving unit is unrelated with the driving unit, so as to eliminate influence of the threshold voltage of the driving unit on the driving current. Thus, stability of the driving current can be raised, and then uniformity of display brightness of the display device can be improved.

Some embodiments of the present disclosure are described above. However, the protection of the present disclosure is not limited thereto. Any alternations or replacements easily conceived by those skilled in the art within the scope of the present disclosure shall be covered within the scope of the present disclosure. Therefore, the scope of the present disclosure shall be subjected to the protection scope of the Claims.

The present application claims the priority of a Chinese patent application No. 201610004113.8 filed on Jan. 4, 2016. Herein, the content disclosed by the Chinese patent application is incorporated in full by reference as a part of the present disclosure.

What is claimed is:

1. A pixel circuit, comprising:

a threshold compensation unit, connected to a first level terminal, a first scanning signal terminal, a first node, a second node and a third node, configured to pull a voltage of the first node and a voltage of the first level terminal to be uniform and pull a voltage of the third node and a voltage of the second node to be uniform under the control of the voltage of the first scanning signal terminal, and further configured to make the voltage of the first node and the voltage of the third node have an equipotential change and store the voltage of the first node and the voltage of the third node, so that the voltage of the first node is changed into a voltage sum obtained by adding the threshold voltage of the driving unit a voltage difference obtained by subtracting the voltage of the third level terminal from the voltage of the data signal terminal;

a driving unit, connected to the first node, the second node, a second level terminal, a fourth node and a third scanning signal terminal, and configured to output a driving current through the fourth node under the control of the voltage of the first node and a voltage of the third scanning signal terminal, or adjust the voltage of the second node into a voltage difference between the voltage of the first node and a threshold voltage of the driving unit under the control of the voltage of the first node;

a data writing unit, connected to a data signal terminal, a second scanning signal terminal and the third node, and configured to pull the voltage of the third node and the voltage of the data signal terminal to be uniform under the control of a voltage of a second scanning signal terminal;

a resetting unit, connected to the second scanning signal terminal, a third level terminal and the fourth node, and configured to pull a voltage of the fourth node and a voltage of a third level terminal to be uniform under the control of the voltage of the second scanning signal terminal;

an EL light-emitting unit, connected to the fourth node and a fourth level terminal, and configured to display gray scales through driving current input by the fourth node; and a feedback unit, connected to the third node and the fourth node, and configured to store the voltage of the third node and the voltage of the fourth node and make the voltage of the third node and the voltage of the fourth node have an equipotential change.

2. The pixel circuit according to claim 1, wherein the threshold compensation unit comprises:

a first transistor, whose first terminal is connected to the first level terminal, a second terminal is connected to the first node, and gate is connected to the first scanning signal terminal;

a second transistor, whose first terminal is connected to the second node, second terminal thereof is connected to the third node, and gate thereof is connected to the first scanning signal terminal;

a first capacitor, whose first electrode is connected to the first node, and second electrode is connected to the third node.

3. The pixel circuit according to claim 1, wherein the driving unit comprises:

a driving transistor, whose source is connected to the second level terminal, drain thereof is connected to the second node, and gate is connected to the first node;

a third transistor, whose first terminal is connected to the second node, second terminal thereof is connected to the fourth node, and gate thereof is connected to the third scanning signal terminal.

4. The pixel circuit according to claim 1, wherein the data writing unit comprises:

a fourth transistor, whose first terminal is connected to the data signal terminal, second terminal is connected to the third node, and gate is connected to the second scanning signal terminal.

5. The pixel circuit according to claim 1, wherein the resetting unit comprises:

a fifth transistor, whose first terminal is connected to the third level terminal, second terminal is connected to the fourth node, and gate is connected to the second scanning signal terminal.

6. The pixel circuit according to claim 1, wherein the EL light-emitting unit comprises:

a light-emitting diode, whose anode is connected to the fourth node, and cathode thereof is connected to the fourth level terminal.

7. The pixel circuit according to claim 1, wherein the feedback unit comprises:

a second capacitor, whose first electrode is connected to the third node, and second electrode is connected to the fourth node.

8. A display device, comprising the pixel circuit according to claim 1.

9. The display device according to claim 8, wherein the threshold compensation unit comprises:

a first transistor, whose first terminal is connected to the first level terminal, a second terminal is connected to the first node, and gate is connected to the first scanning signal terminal;

a second transistor, whose first terminal is connected to the second node, second terminal thereof is connected to the third node, and gate thereof is connected to the first scanning signal terminal;

a first capacitor, whose first electrode is connected to the first node, and second electrode is connected to the third node.

10. The display device according to claim 8, wherein the driving unit comprises:

a driving transistor, whose source is connected to the second level terminal, drain thereof is connected to the second node, and gate is connected to the first node;

a third transistor, whose first terminal is connected to the second node, second terminal thereof is connected to the fourth node, and gate thereof is connected to the third scanning signal terminal.

11. The display device according to claim 8, wherein the data writing unit comprises:

a fourth transistor, whose first terminal is connected to the data signal terminal, second terminal is connected to the third node, and gate is connected to the second scanning signal terminal.

12. The display device according to claim 8, wherein the resetting unit comprises:

a fifth transistor, whose first terminal is connected to the third level terminal, second terminal is connected to the fourth node, and gate is connected to the second scanning signal terminal.

13. The display device according to claim 8, wherein the EL light-emitting unit comprises:

a light-emitting diode, whose anode is connected to the fourth node, and cathode thereof is connected to the fourth level terminal.

14. The display device according to claim 8, wherein the feedback unit comprises:

a second capacitor, whose first electrode is connected to the third node, and second electrode is connected to the fourth node.

15. A driving method for driving the pixel circuit including a threshold compensation unit, a driving unit, a data writing unit, a resetting unit, an EL light-emitting unit and a feedback unit, comprising:

in a first phase, pulling a voltage of a first node and a voltage of a first level terminal to be uniform and pulling a voltage of a third node and a voltage of a second node to be uniform by the threshold compensation unit under the control of a voltage of a first scanning signal terminal, adjusting the voltage of the second node into a voltage difference between the voltage of the first node and a threshold voltage of the driving unit by the driving unit under the control of the voltage of the first node, and storing the voltage of the first node and the voltage of the third node by the threshold compensation unit, in a second phase, pulling the voltage of the third node and a voltage of a data signal terminal to be uniform by the data writing unit under the control of a voltage of a second scanning signal terminal, making the voltage of the first node and the voltage of the third node have an equipotential change by the threshold compensation unit, pulling a voltage of a fourth node and a voltage of a third level terminal to be uniform by the resetting unit under the control of the voltage of the first scanning signal terminal, and making the voltage of the third node and the voltage of the fourth node have an equipotential change by the feedback unit; and in a third phase, outputting a driving current through a fourth node by the driving unit under the control of the voltage of the first node and a voltage of a third scanning signal, making the voltage of the third node and the voltage of the fourth node have an equipotential change by the feedback unit, making the voltage of the first node and the voltage of the third node have an eouipotential change by the threshold compensation unit, and displaying gray scales through a driving current input by the fourth node by the EL light-emitting unit, so that the voltage of the first node is changed into a voltage sum obtained by adding the threshold voltage of the driving unit with a voltage difference obtained by subtracting thevoltage of the third level terminal from the voltage of the data signal terminal.

* * * * *